(12) United States Patent
Sato et al.

(10) Patent No.: US 9,722,085 B2
(45) Date of Patent: Aug. 1, 2017

(54) ELECTRONIC DEVICE AND METHOD OF MANUFACTURING THE SAME

(71) Applicant: FUJITSU LIMITED, Kawasaki-shi, Kanagawa (JP)

(72) Inventors: Shintaro Sato, Atsugi (JP); Hideyuki Jippo, Atsugi (JP); Mari Ohfuchi, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/665,188

(22) Filed: Mar. 23, 2015

(65) Prior Publication Data

US 2015/0280012 A1    Oct. 1, 2015

(30) Foreign Application Priority Data

Mar. 27, 2014  (JP) .................................. 2014-067104

(51) Int. Cl.

| H01L 29/786 | (2006.01) |
|---|---|
| H01L 21/04 | (2006.01) |
| H01L 29/16 | (2006.01) |
| H01L 29/167 | (2006.01) |
| H01L 21/02 | (2006.01) |
| H01L 29/73 | (2006.01) |
| H01L 29/739 | (2006.01) |
| H01L 29/778 | (2006.01) |

(52) U.S. Cl.
CPC .. *H01L 29/78684* (2013.01); *H01L 21/02425* (2013.01); *H01L 21/02433* (2013.01); *H01L 21/02527* (2013.01); *H01L 21/02576* (2013.01); *H01L 21/02579* (2013.01); *H01L 21/02664* (2013.01); *H01L 21/043* (2013.01); *H01L 29/1606* (2013.01); *H01L 29/167* (2013.01); *H01L 29/7311* (2013.01); *H01L 29/7391* (2013.01); *H01L 29/78696* (2013.01); *H01L 29/778* (2013.01)

(58) Field of Classification Search
CPC ...................................................... H01L 21/043
See application file for complete search history.

(56) References Cited

U.S. PATENT DOCUMENTS

2012/0075008 A1* 3/2012 Heo .................... H01L 29/1606
327/534

FOREIGN PATENT DOCUMENTS

JP    2012-36040 A1    2/2012

OTHER PUBLICATIONS

J. Cai, et al.; "Atomically precise bottom-up fabrication of graphene nanoribbons;" Nature; vol. 466; Jul. 22, 2010; pp. 470-473 (4 Sheets)/p. 2 of specification.

* cited by examiner

*Primary Examiner* — Alexander Ghyka
(74) *Attorney, Agent, or Firm* — Kratz, Quintos & Hanson, LLP

(57) ABSTRACT

A transistor includes a channel layer in which a plurality of graphene whose edge portions are terminated with modifying groups different from each other are bonded to each other; a gate electrode formed on the channel layer via a gate insulating film; and a source electrode and a drain electrode formed on the channel layer.

7 Claims, 13 Drawing Sheets

FIG. 4

|            | Graphene | H    | F    | Cl   | OH   | NH₂   | CH₃  |
|------------|----------|------|------|------|------|-------|------|
| Conduction |          | 3    | 4.22 | 4.2  | 3.23 | 2.28  | 2.82 |
| Valence    |          | 4.56 | 5.32 | 5.36 | 4.03 | 3.21  | 3.92 |
| Ef         | 4.2      | 3.78 | 4.77 | 4.78 | 3.63 | 2.745 | 3.37 |
| Eg         |          | 1.56 | 1.1  | 1.16 | 0.8  | 0.93  | 1.1  |

ELECTRONIC DEVICE AND METHOD OF MANUFACTURING THE SAME

CROSS-REFERENCE TO RELATED APPLICATIONS

This application is based upon and claims the benefit of priority of the prior Japanese Patent Application No. 2014-067104, filed on Mar. 27, 2014, the entire contents of which are incorporated herein by reference.

FIELD

The embodiments discussed herein are directed to an electronic device and a method of manufacturing the same.

BACKGROUND

In current LSI, its characteristics have been improved by miniaturization. However, in accordance with the progress of the miniaturization, a gate length of transistors has become below 30 nm, which is giving rise to adverse effects of the miniaturization. Therefore, an attempt is being made to achieve the characteristic improvement by using channel materials having a higher mobility instead of conventionally used silicon. As candidates for these materials, compound semiconductors such as germanium and InGaAs are named, but graphene which is a two-dimensional material and has a very high mobility is also drawing attention.

Having a high mobility of about 100,000 $cm^2/Vs$ even at room temperature and being free from difference in mobility between electrons and holes, graphene is expected as a future channel material. However, not having a band gap, it has a small on-off ratio as it is and its use as a switching element is difficult. Various methods for forming a band gap have been proposed, and as one of them, a method of forming a band gap by forming graphene into a nanoribbon has been proposed.

Patent Document 1: Japanese Laid-open Patent Publication No. 2012-36040
Non-patent Document 1: J. Cai et al., Nature 466 (2010) 470.

It has been reported by academic papers and so on to improve an on-off ratio by forming a band gap by forming graphene into a nanoribbon. At present, however, this is still on a research stage and in many cases, it is not found out what kind of structure should be formed in fabricating a device by using the graphene nanoribbon. Further, in order to use it as a switching element, what is called polarity control is important, but it is hard to say that a method for such control has been established.

SUMMARY

An electronic device according to an aspect of the present invention includes: a channel layer in which a plurality of graphene whose edge portions are terminated with modifying groups different from each other are bonded to each other; and electrodes formed above the channel layer.

A method of manufacturing an electronic device according to an aspect of the present invention includes: forming one graphene whose edge portion is terminated with one modifying group; forming at least part of the one graphene into another graphene whose edge portion is terminated with another modifying group different from the one modifying group to form a channel layer in which the one graphene and the other graphene are bonded to each other; and forming electrodes above the one graphene and the other graphene respectively.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a view representing a table in which the energies at the bottoms of the conduction bands and the tops of the valence bands, Fermi levels, and energy gaps in the respective GNRs are summarized.

DESCRIPTION OF EMBODIMENTS (Basic Gist of Present Invention)
First, the basic technical gist of an electronic device according to the present invention and a method of manufacturing the same will be described.

Figure 1:
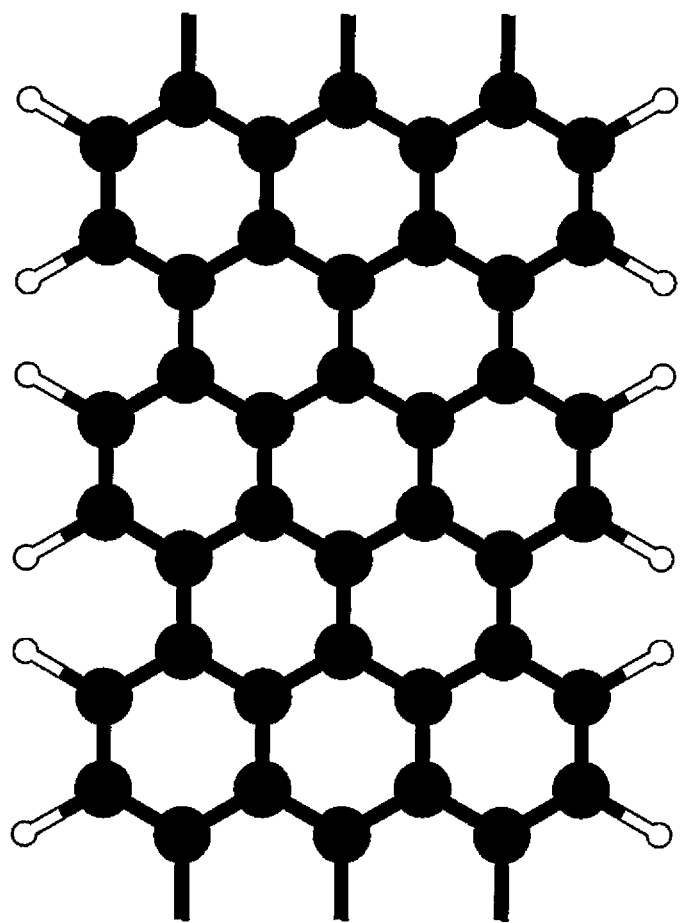
FIG. 1 is a view illustrating a H-terminated bottom-up GNR formed from an anthracene dimer being a precursor.

In the present invention, edges of graphene nanoribbons (GNR) are modified by various atoms, whereby GNRs different in work function and band gap are formed. In FIG. 1, a bottom-up GNR which is formed from an anthracene dimer being a precursor and whose edge portions are terminated with a modifying group, here, by hydrogen (H), is exemplified.

Figure 2:
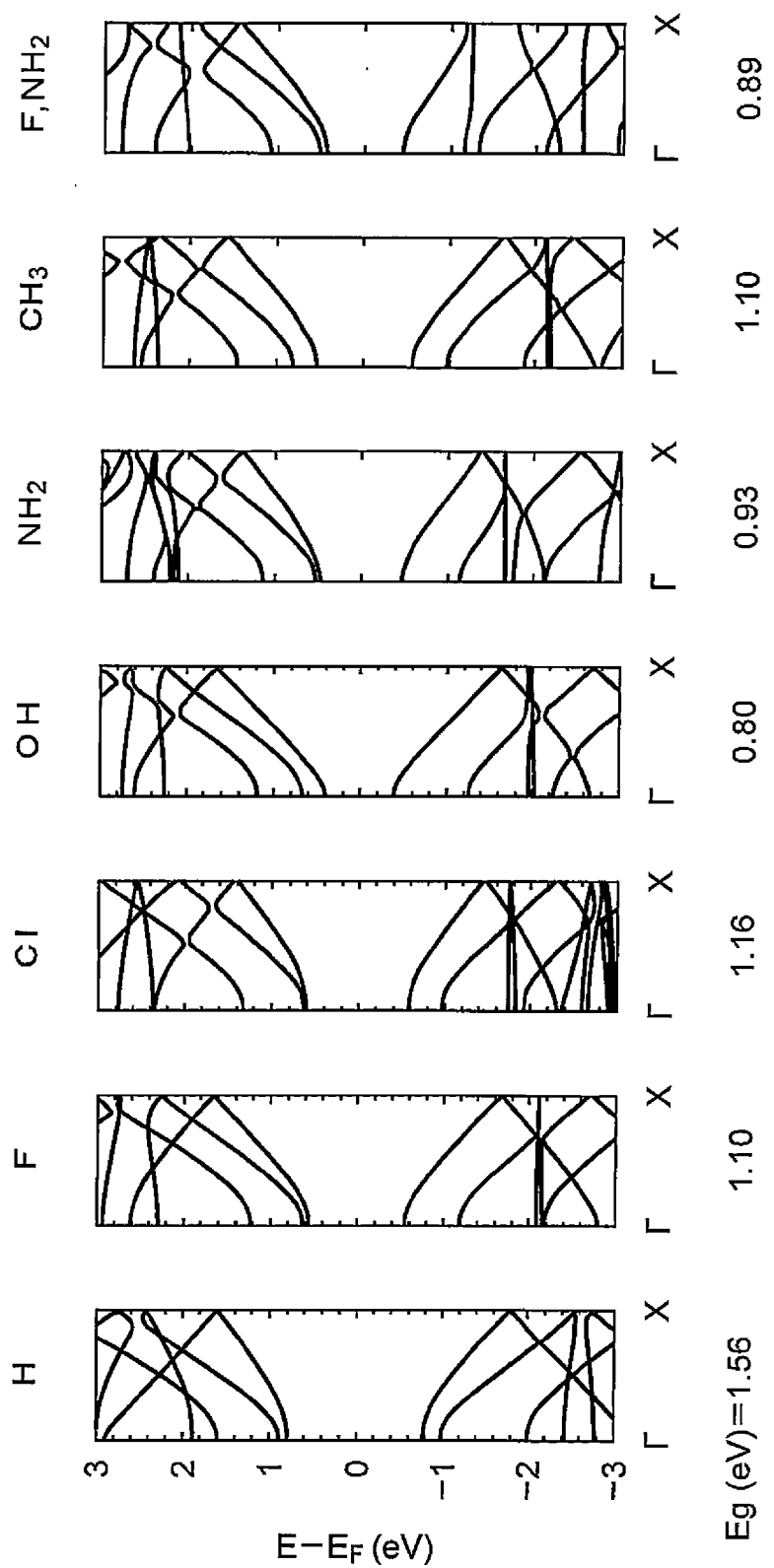
FIG. 2 is a view illustrating band structures of GNRs when modifying groups are variously changed.
Figure 3:
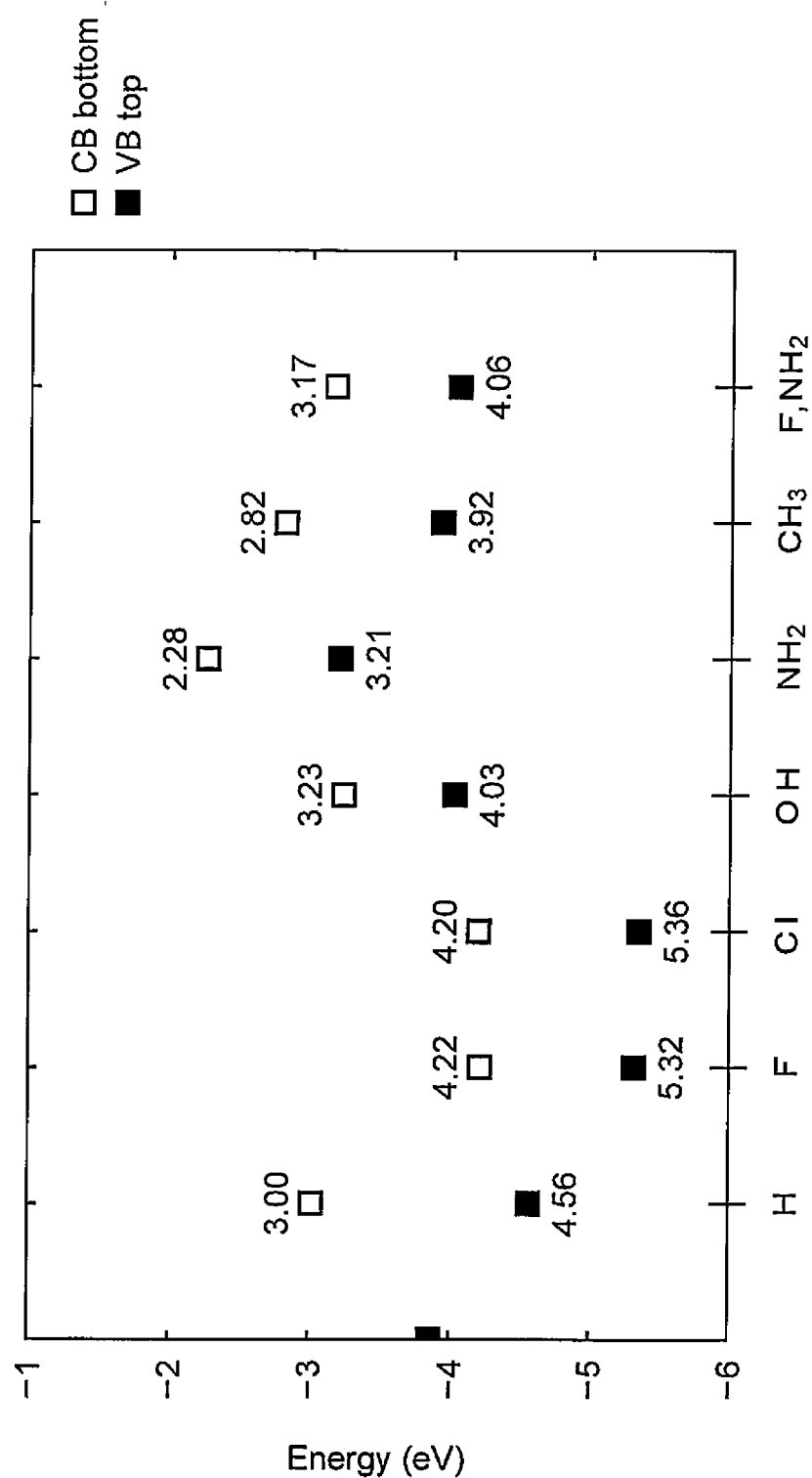
FIG. 3 is a chart representing energies at bottoms of conduction bands and tops of valence bands in the respective GNRs.

FIG. 2 illustrates band structures of GNRs when the modifying groups are variously changed. FIG. 3 represents energies at bottoms of conduction bands and tops of valence bands in the respective GNRs. Fermi levels of the respective GNRs are each located at the middle of the conduction band and the valence band. In FIG. 3, vacuum levels of the respective GNRs (Hartree Pot. of a vacuum region most distant from GNR) are made equal. FIG. 4 represents a table in which the energies at the bottoms of the conduction bands and the tops of the valence bands, the Fermi levels, and energy gaps in the respective GNRs are summarized. At this time, as the structure of each of the GNRs, an armchair GNR in which the number of dimer lines is seven as illustrated in FIG. 1 was assumed. It has been confirmed by the first-principles calculation that, when, for example, two kinds of such GNRs are combined to be bonded, a Fermi level of the resultant composite GNR has an about average value of Fermi levels of the respective GNRs.

Figure 5A:
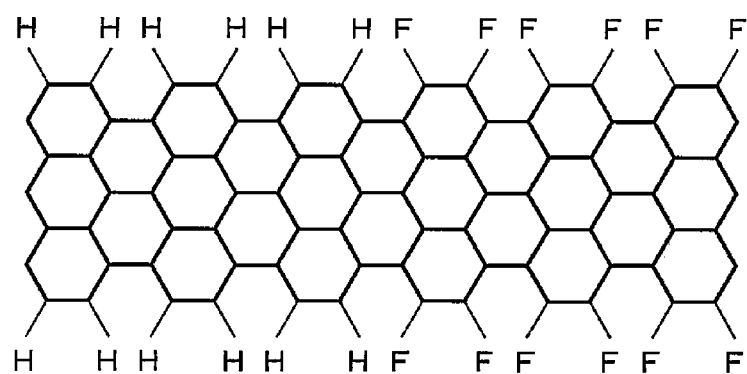
FIG. 5A and FIG. 5B are views illustrating a structure and an electron state of a composite GNR.
Figure 5B:
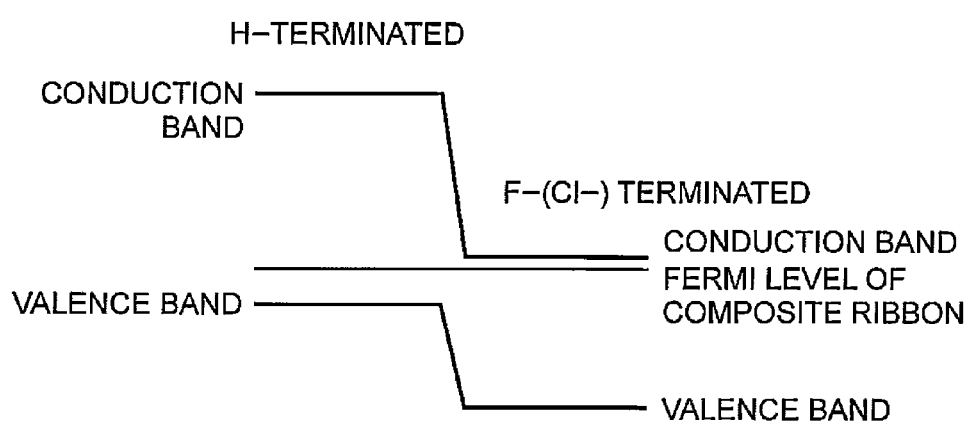

FIG. 5A illustrates a composite GNR which is a combination of GNRs terminated with hydrogen (H) and terminated with fluorine (F) (or terminated with chlorine (Cl)), and FIG. 5B illustrates an electron state of this composite GNR. In this case, one whose original Fermi level is shallower is p-doped and one whose original Fermi level is deeper is n-doped. That is, the H-terminated GNR is a p-type and the F-terminated GNR is an n-type, so that a pn junction is formed. Here, by using the Cl-terminated GNR instead of the F-terminated GNR, it is also possible to form substantially the same pn junction since the Fermi levels of the both are close to each other. Strictly speaking, the Fermi levels of the GNRs having the different modifying groups illustrated in FIG. 3 are all different, and therefore, by any combination of the GNRs presented in FIG. 3, the pn junction is formed. However, depending on a difference in the Fermi level and a difference in band gap, a doping degree differs, and generally, the larger the difference in the original Fermi level is, the stronger they are p- or n-doped. In the example presented in FIG. 3, when a F- or Cl-terminated GNR and a $NH_2$-terminated GNR are combined, the pn junction with the highest doping degree is formed.

Figure 6:
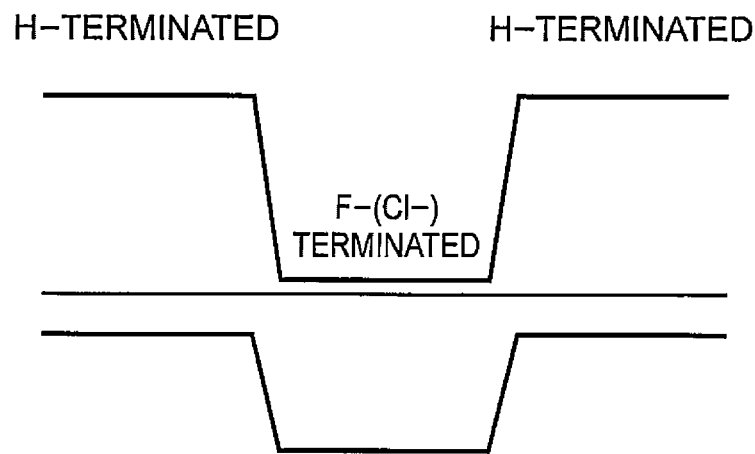
FIG. 6 is a view illustrating an electron state of a composite GNR.

By combining the GNRs terminated with the different modifying groups as described above, it is possible to form not only a simple pn junction but also a pnp structure or an npn structure. FIG. 6 illustrates an example where the pnp structure is formed by connecting H-terminated, F- (or Cl-) terminated, and H-terminated GNRs. Conversely, by bonding F-terminated, H-terminated, and F-terminated GNRs, it is possible to form the npn structure. By using this structure, it is also possible to fabricate what is called a field-effect transistor and also a CMOS structure using this. Such a pnp or npn structure can be formed by any combination of the GNRs having the different modifying groups illustrated in FIG. 2.

As the aforesaid combination of the GNRs terminated with the different modifying groups, by combining not only two kinds of GNRs but also by combining three kinds of GNRs or more, it is also possible to form a more complicated doping structure.

Figure 7:
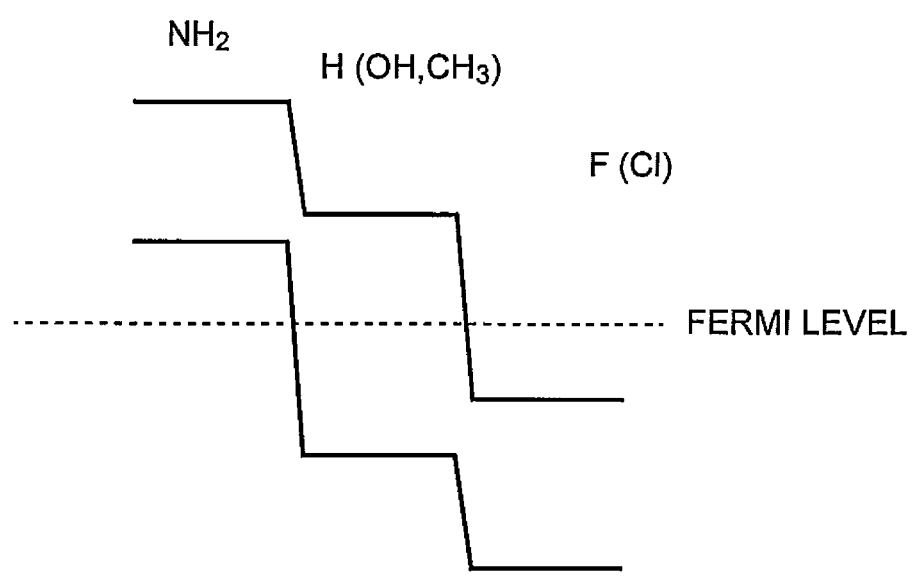
FIG. 7 is a chart illustrating an electron state of a composite GNR.

FIG. 7 is a schematic chart of band alignment when $NH_2$-terminated, H- (or OH- or $CH_3$-) terminated, and F- (or Cl-) terminated GNRs are combined and bonded. In this case as well, a Fermi level is substantially equal to an average of Fermi levels of the respective GNRs. As is seen from FIG. 7, it is possible to form a $p^+in^+$ structure. By using such a structure, it is possible to fabricate a tunnel transistor.

Figure 8:
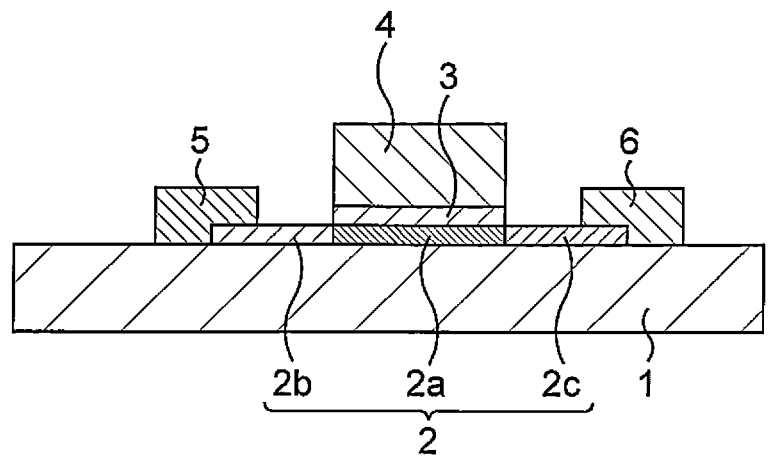
FIG. 8 is a schematic cross-sectional view illustrating an example of a tunnel transistor having a $p^+in^+$ structure.

FIG. 8 is a schematic cross-sectional view illustrating an example of the tunnel transistor having the $p^+in^+$ structure.

In this tunnel transistor, a channel layer 2 is formed on a silicon substrate 1 having an insulating film such as a silicon oxide film on a surface. The channel layer 2 has a 10 nm width or less in a short side direction and is formed by bonding a $NH_2$-terminated GNR 2b and a F-terminated GNR 2c to both sides of a H-terminated GNR 2a. On the H-terminated GNR 2a, a gate electrode 4 of, for example Ti/Au is formed via a gate insulating film 3. On the $NH_2$-terminated GNR 2b, a source electrode 5 of, for example, Ti/Au is formed, and on the F-terminated GNR 2c, a drain electrode 6 of, for example, Ti/Au is formed.

As the gate electrode 4, the source electrode 5, and the drain electrode 6, those whose work functions are close to a Fermi level of the channel layer 2 being a composite GNR are desirably used. According to calculation, the Fermi level of the channel layer 2 is about 3.8 eV. Therefore, in this case, it is necessary to select metal whose work function is relatively small, but in our calculation, there is a tendency for an absolute value of the Fermi level (measured from a vacuum level) to be smaller, and therefore, in this example, Ti is used as an electrode interface. Incidentally, in the example in FIG. 8, a $p^+$ side is used as the source electrode, but an $n^+$ side may be used as the source electrode.

Figure 9:
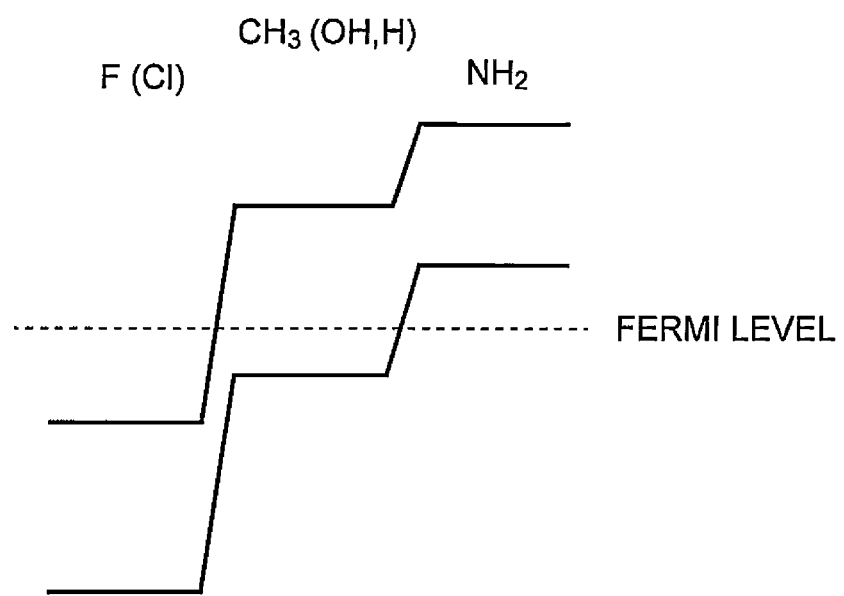
FIG. 9 is a schematic chart illustrating band alignment of a composite GNR.

FIG. 9 is a schematic chart of band alignment when F-terminated, $CH_3$- (or OH- or H-) terminated, and $NH_2$-terminated GNRs are combined to be bonded. In this case, an $n^+p^-p^+$ structure is formed, which can be used as a transistor.

Figure 10:
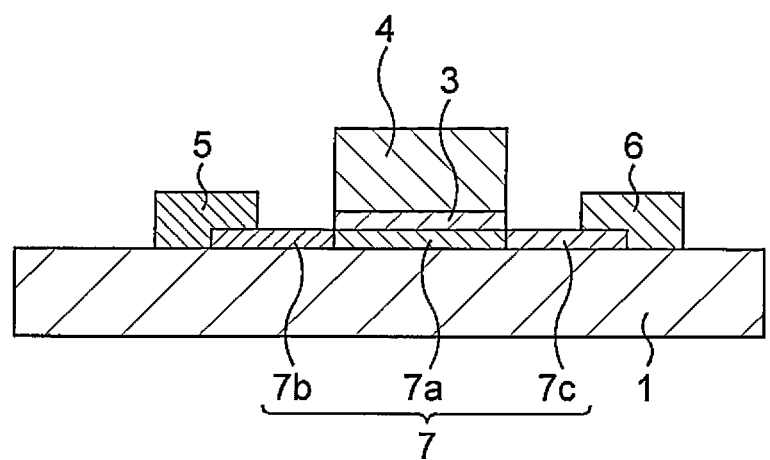
FIG. 10 is a schematic cross-sectional view illustrating an example of a tunnel transistor having an $n^+p^-p^+$ structure.

FIG. 10 is a schematic cross-sectional view illustrating an example of the tunnel transistor having the $n^+p^-p^+$ structure.

In this tunnel transistor, a channel layer 7 is formed on a silicon substrate 1 having an insulating film such as a silicon oxide film on a surface. The channel layer 7 has a 10 nm width or less in a short side direction and is formed by bonding a F-terminated GNR 7b and a $NH_2$-terminated GNR 7c to both sides of a $CH_3$-terminated GNR 7a. On the $CH_3$-terminated GNR 7a, a gate electrode 4 of, for example, Ti/Au is formed via a gate insulating film 3. On the F-terminated GNR 7b, a source electrode 5 of, for example, Ti/Au is formed, and on the $NH_2$-terminated GNR 7c, a drain electrode 6 of, for example, Ti/Au is formed.

A structure applicable to a tunnel transistor can be realized not only by a composite GNR including three kinds of terminated GNRs whose terminating modifying groups are different as described above but also by a composite GNR including two kinds of terminated GNRs, doping, and so on.

Figure 11A:
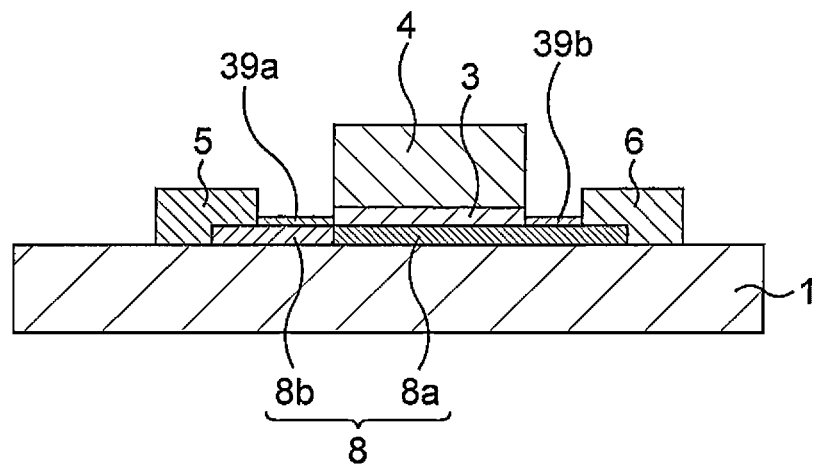
FIG. 11A and FIG. 11B are views illustrating a structure and band alignment of a tunnel transistor having an $n^+p^-p^+$ structure.

FIG. 11A is a schematic cross-sectional view illustrating an example of a tunnel transistor having an $n^+p^-p^+$ structure formed by a composite GNR including two kinds of terminated GNRs and doping.

In this tunnel transistor, a channel layer 8 is formed on a silicon substrate 1 having an insulating film such as a silicon oxide film on a surface. The channel layer 8 has a 10 nm width or less in a short side direction and is formed by bonding an H-terminated GNR 8a and a F-terminated GNR 8b. On the H-terminated GNR 8a, a gate electrode 4 of, for example, Ti/Au with a gate insulating film 3 therebetween and a drain electrode 6 of, for example, Ti/Au are formed so as to be apart from each other. On the F-terminated GNR 8b, a source electrode 5 of, for example, Ti/Au is formed. On the F-terminated GNR 8b, for example, PEI (Polyethylenimine) 9a being an n-type dopant molecule is formed in a region between the gate electrode 4 and the source electrode 5. On the H-terminated GNR 8a, for example, F$_4$-TCNQ (2,3,5, 6-tetrafluoro-7,7,8,8-tetracyanoquinodimethane) 9b being a p-type dopant molecule is formed in a region between the gate electrode 4 and the drain electrode 6.

Figure 11B:
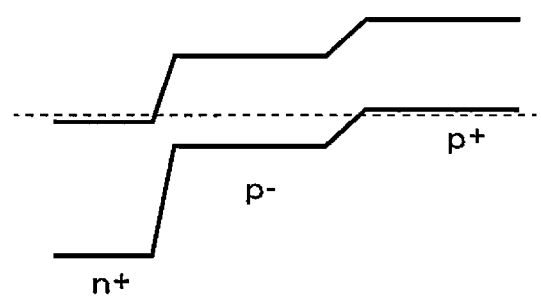

FIG. 11B illustrates a schematic chart of band alignment when the F-terminated and H-terminated GNRs in the tunnel transistor in FIG. 11A are combined to be bonded.

As described above, by appropriately combining a plurality of GNRs having different terminating modifying groups, it is possible to realize an electronic device having various polarity combinations.

(First Embodiment)

Hereinafter, a first embodiment will be described. In this embodiment, a transistor with a pnp structure using GNRs will be described together with its manufacturing method.

FIG. 12A to FIG. 12D are schematic cross-sectional views illustrating the manufacturing method of the transistor having the pnp structure according to the first embodiment in order of processes.

Figure 12A:
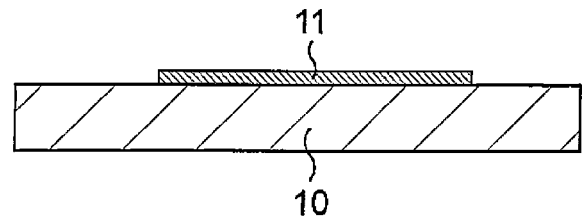
FIG. 12A to FIG. 12D are schematic cross-sectional views illustrating a method of manufacturing a transistor having a pnp structure according to a first embodiment in order of processes.

First, as illustrated in FIG. 12A, a H-terminated GNR 11 is formed.

In more detail, by using an anthracene dimer being a precursor of the GNR, whose edge portions are terminated with H, it is polymerized on a Au(111) substrate or a Ag(111) substrate by heat energy. Concretely, the same method as that of Non-patent Document 1 is used. First, the anthracene dimer precursor is vapor-deposited on the Au(111) substrate or the Ag(111) substrate heated to, for example, about 180° C. to about 250° C. At this time, the anthracene dimer precursor is coupled on a straight line by radical polymerization.

Further, the substrate temperature is increased to, for example, about 350° C. to about 450° C. and this temperature is kept for about ten minutes to about twenty minutes. Consequently, due to a ring-condensation reaction, an armchair-type anthracene GNR which has a uniform width of about 0.7 nm and whose edge structure along a longitudinal direction is complete is formed.

Instead of the anthracene dimer, a pentacene dimer, a nonacene dimer, or like can be used. Consequently, the H-terminated GNR 11 whose edge portions are H-terminated is formed.

Next, the H-terminated GNR 11 is transferred onto a silicon substrate 10 having an insulating film such as a silicon oxide film on a surface.

Figure 12B:
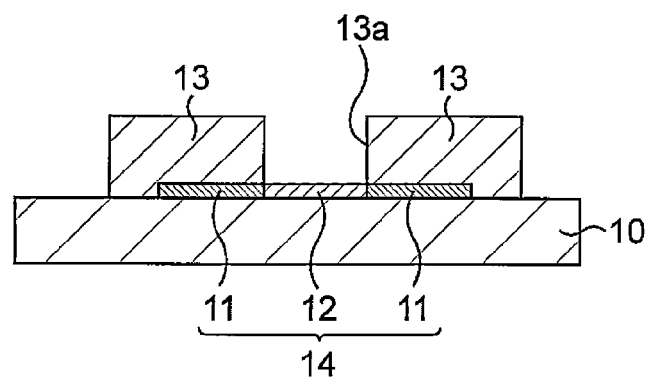

Subsequently, as illustrated in FIG. 12B, a center portion of the H-terminated GNR 11 is formed into a F-terminated GNR 12.

In more detail, first, a resist is applied on the silicon substrate 10 so as to cover the H-terminated GNR 11, and the resist is patterned by lithography. Consequently, a resist mask 13 having an opening 13a from which the center portion of the H-terminated GNR 11 is exposed is formed.

Next, this silicon substrate 10 is heated in a fluorine atmosphere, whereby the center portion of the H-terminated GNR 11 exposed from the opening 13a is fluorinated. Consequently, the F-terminated GNR 12 is formed in the center portion of the H-terminated GNR 11. Consequently, a channel layer 14 in which the H-terminated GNR 11 and the F-terminated GNR 12 are bonded to each other is formed.

Figure 12C:
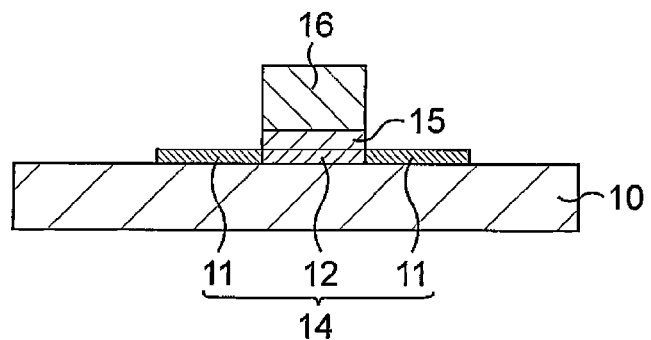

Subsequently, as illustrated in FIG. 12C, a gate insulating film 15 and a gate electrode 16 are formed.

In more detail, Al is thinly deposited to about 1 nm on the whole surface by a sputtering method or the like, and by using this Al as a seed layer, an insulating material, for example, HfO$_2$ is deposited by an atomic layer deposition (ALD) method. Further, on HfO$_2$, metals (for example, Ti/Au) are deposited by a vapor deposition method or a sputtering method. The resist mask 13, and HfO$_2$ and Ti/Au deposited on the resist mask 13 are removed by lift-off. Consequently, the gate electrode 16 formed of Ti/Au is formed on the F-terminated GNR 12 via the gate insulating film 15 formed of HfO$_2$.

Figure 12D:
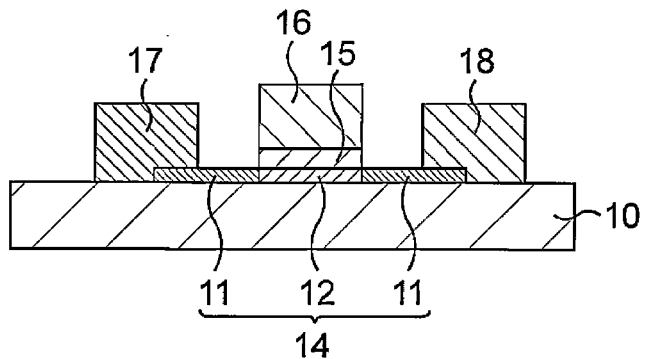

Subsequently, as illustrated in FIG. 12D, a source electrode 17 and a drain electrode 18 are formed.

In more detail, a resist is applied on the whole surface, and the resist is patterned by lithography. Consequently, a resist mask having openings from which both side portions of the H-terminated GNR 11 are exposed is formed.

Next, metals (for example, Ti/Au) are deposited by a vapor deposition method or a sputtering method. Then, the resist mask and Ti/Au deposited thereon are removed by lift-off. Consequently, the source electrode 17 and the drain electrode 18 are formed on the both end portions of the H-terminated GNR 11.

Thereafter, exposed portions of the channel layer 14 are covered by HfO$_2$ or the like by an ALD method, thereby forming a protective film, and through various post-processes, the transistor is formed.

The transistor according to this embodiment functions as the transistor having the pnp structure.

According to this embodiment, by using the channel layer 14 of the graphene whose polarity control is possible, the transistor with the pnp structure having high reliability and high performance is realized.

Incidentally, it is also possible to form a transistor having an npn structure in the similar manner as that of this embodiment. In this case, for example, a center portion of a channel layer of GNR is formed as a H-terminated GNR, and its both end portions are formed as F-terminated GNRs, and they are bonded.

(Second Embodiment)

Next, a second embodiment will be described. In this embodiment, a tunnel transistor with a pin structure using GNRs will be described together with its manufacturing method.

FIG. 13A to FIG. 13E are schematic cross-sectional views illustrating the manufacturing method of the tunnel transistor having the p$^+$in$^+$ structure according to the second embodiment in order of processes.

Figure 13A:
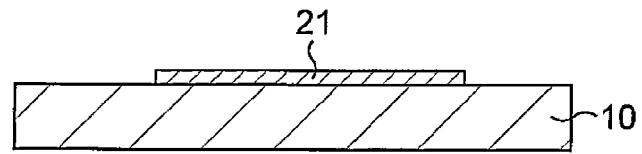
FIG. 13A to FIG. 13E are schematic cross-sectional views illustrating a method of manufacturing a tunnel transistor having a $p^+in^+$ structure according to a second embodiment in order of processes.

First, as illustrated in FIG. 13A, a NH$_2$-terminated GNR 21 is formed.

In more detail, by using an anthracene dimer being a precursor of the GNR, whose edge portions are terminated with NH$_2$, it is polymerized on a Au(111) substrate or a Ag(111) substrate by heat energy by the same method as that of the first embodiment. Instead of the anthracene dimer, a pentacene dimer, a nonacene dimer, or like can be used. Consequently, the NH$_2$-terminated GNR 21 whose edge portions are modified by NH$_2$ is formed.

Next, the NH$_2$-terminated GNR 21 is transferred onto a silicon substrate 10 having an insulating film such as a silicon oxide film on a surface.

Figure 13B:
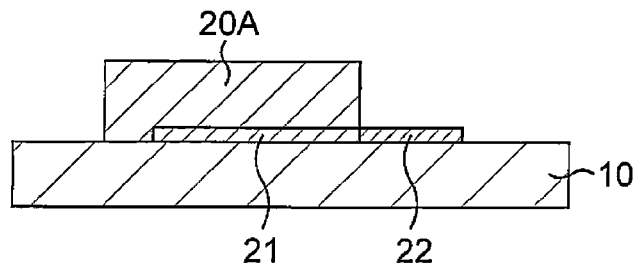

Subsequently, as illustrated in FIG. 13B, one-side portion of the NH$_2$-terminated GNR 21 is formed into a F-terminated GNR 22.

In more detail, first, a resist is applied on the silicon substrate 10 so as to cover the NH$_2$-terminated GNR 21, and the resist is patterned by lithography. Consequently, a resist mask 20A from which only the one-side (in the illustrated example, a right side) portion of the NH$_2$-terminated GNR 21 is exposed is formed.

Next, this silicon substrate 10 is heated in a fluorine atmosphere, whereby the right-side portion of the $NH_2$-terminated GNR 21 exposed from the resist mask 20A is fluorinated. Consequently, the F-terminated GNR 22 is formed in the right-side portion of the $NH_2$-terminated GNR 21.

The resist mask 20A is removed by ashing or wetting.

Figure 13C:
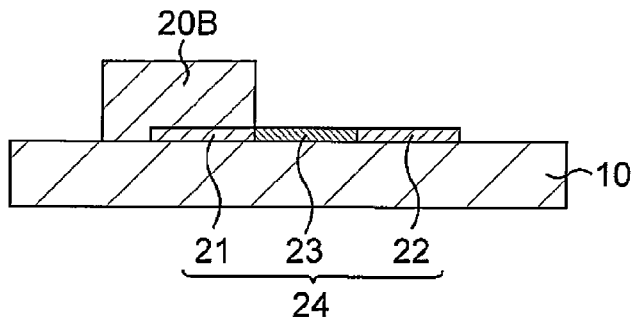

Subsequently, as illustrated in FIG. 13C, a center portion of the $NH_2$-terminated GNR 21 in FIG. 13A is formed into a H-terminated GNR 23.

In more detail, first, a resist is applied on the silicon substrate 10 so as to cover the $NH_2$-terminated GNR 21 and the F-terminated GNR 22, and the resist is patterned by lithography. Consequently, a resist mask 20B covering only the other side (in the illustrated example, a left side) portion of the $NH_2$-terminated GNR 21 and exposing the center portion of the $NH_2$-terminated GNR 21 in FIG. 13A and the F-terminated GNR 22 is formed.

Next, this silicon substrate 10 is heated in a hydrogen atmosphere. At this time, the structure of the F-terminated GNR 22 undergoes little change because the F-terminated GNR 22 is more stable to heat than the $NH_2$-terminated GNR 21. On the other hand, the exposed portion of the $NH_2$-terminated GNR 21 becomes the H-terminated GNR 23 due to the heating. Consequently, a channel layer 24 in which the center portion is the H-terminated GNR 23 and the F-terminated GNR 22 and the $NH_2$-terminated GNR 21 are bonded to the right side and the left side of the H-terminated GNR 23 respectively is formed.

The resist mask 20B is removed by ashing or wetting.

Figure 13D:
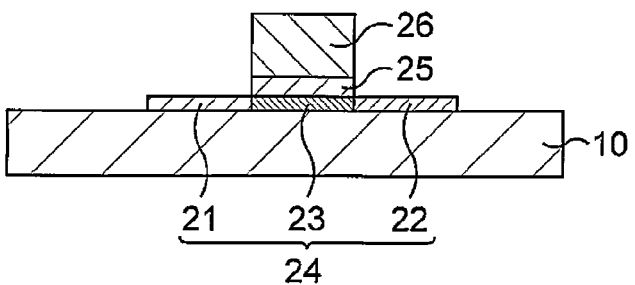

Subsequently, as illustrated in FIG. 13D, a gate insulating film 25 and a gate electrode 26 are formed.

In more detail, first, a resist is applied on the whole surface, and the resist is patterned by lithography. Consequently, a resist mask having an opening from which the H-terminated GNR 23 is exposed is formed.

Next, Al is thinly deposited to about 1 nm on the whole surface by a sputtering method or the like, and by using this Al as a seed layer, an insulating material, for example, $HfO_2$ is deposited by an atomic layer deposition (ALD) method. Further, on $HfO_2$, metals (for example, Ti/Au) are deposited by a vapor deposition method or a sputtering method. Then, the resist mask, and $HfO_2$ and Ti/Au deposited on the resist mask are removed by lift-off. Consequently, the gate electrode 26 formed of Ti/Au is formed on the H-terminated GNR 23 via the gate insulating film 25 formed of $HfO_2$.

Figure 13E:
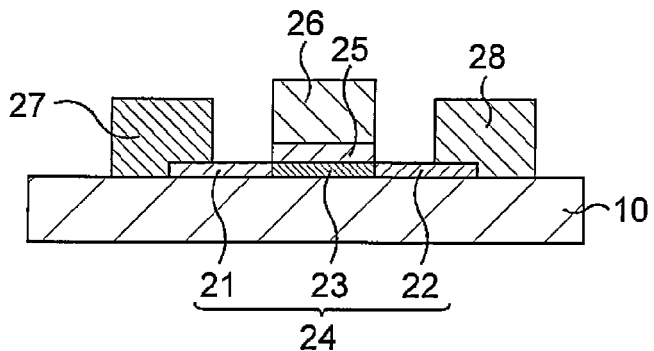

Subsequently, as illustrated in FIG. 13E, a source electrode 27 and a drain electrode 28 are formed.

In more detail, a resist is applied on the whole surface, and the resist is patterned by lithography. Consequently, a resist mask having openings from which the $NH_2$-terminated GNR 21 and the F-terminated GNR 22 are exposed is formed.

Next, metals (for example, Ti/Au) are deposited by a vapor deposition method or a sputtering method. Then, the resist mask and Ti/Au deposited thereon are removed by lift-off. Consequently, the source electrode 27 and the drain electrode 28 are formed on one and the other of the $NH_2$-terminated GNR 21 and the F-terminated GNR 22 respectively. The illustrated example presents a case where the source electrode 27 is formed on the $NH_2$-terminated GNR 21, and the drain electrode 28 is formed on the F-terminated GNR 22, but the source electrode 27 may be formed on the F-terminated GNR 22 and the drain electrode 28 may be formed the $NH_2$-terminated GNR 21.

Thereafter, exposed portions of the channel layer 24 are covered by $HfO_2$ or the like by an ALD method, thereby forming a protective film, and through various post-processes, the transistor is formed.

The transistor according to this embodiment functions as the tunnel transistor having the pin structure.

According to this embodiment, by using the channel layer 24 of the graphene whose polarity control is possible, the tunnel transistor with the $p^+in^+$ structure having high reliability and high performance is realized.

Incidentally, it is also possible to form a tunnel transistor having an $n^+ip^+$ structure in the similar manner as that of this embodiment. In this case, for example, a center portion of a channel layer of GNR is formed as a H-terminated GNR, and its right side is formed as a $NH_2$-terminated GNR, and its left side is formed as a F-terminated GNR 22, and they are bonded.

(Third Embodiment)

Next, a third embodiment will be described. In this embodiment, a tunnel transistor with an $n^+p^-p^+$ structure using GNRs will be described together with its manufacturing method.

FIG. 14A to FIG. 14E are schematic cross-sectional views illustrating the manufacturing method of the tunnel transistor having the $n^+p^-p^+$ structure according to the third embodiment in order of processes.

Figure 14A:
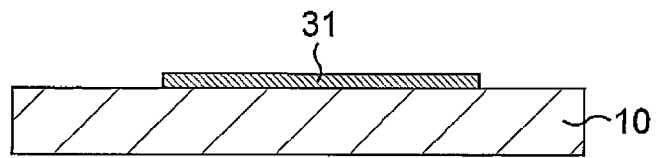
FIG. 14A to FIG. 14E are schematic cross-sectional views illustrating a method of manufacturing a tunnel transistor having an $n^+p^-p^+$ structure according to a third embodiment in order of processes.

First, as illustrated in FIG. 14A, a H-terminated GNR 31 is formed.

In more detail, by using an anthracene dimer being a precursor of the GNR, whose edge portions are terminated with H, it is polymerized on a Au(111) substrate or a Ag(111) substrate by heat energy by the same method as that of the first and second embodiments. Instead of the anthracene dimer, a pentacene dimer, a nonacene dimer, or like can be used. Consequently, the H-terminated GNR 31 whose edge portions are H-terminated is formed.

Next, the H-terminated GNR 31 is transferred onto a silicon substrate 10 having an insulating film such as a silicon oxide film on a surface.

Figure 14B:
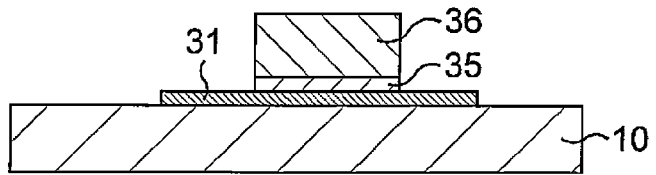

Subsequently, as illustrated in FIG. 14B, a gate insulating film 35 and a gate electrode 36 are formed.

In more detail, first, a resist is applied on the whole surface, and the resist is patterned by lithography. Consequently, a resist mask having an opening from which a center portion of the H-terminated GNR 31 is exposed is formed.

Next, Al is thinly deposited to about 1 nm on the whole surface by a sputtering method or the like, and by using this Al as a seed layer, an insulating material, for example, $HfO_2$ is deposited by an atomic layer deposition (ALD) method. Further, on $HfO_2$. metals (for example, Ti/Au) are deposited by a vapor deposition method or a sputtering method. The resist mask, and $HfO_2$ and Ti/Au deposited on the resist mask are removed by lift-off. Consequently, the gate electrode 36 formed of Ti/Au is formed on the center portion of the H-terminated GNR 31 via the gate insulating film 35 formed of $HfO_2$.

Figure 14C:
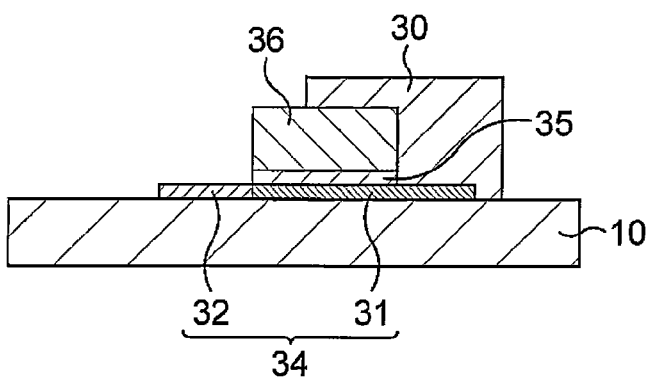

Subsequently, as illustrated in FIG. 14C, one side portion of the H-terminated GNR 31 is formed into a F-terminated GNR 32.

In more detail, first, a resist is applied on the silicon substrate 10 so as to cover the H-terminated GNR 31, and the resist is patterned by lithography. Consequently, a resist mask 30 from which only the one side (in the illustrated example, a left side) portion of the H-terminated GNR 31 is exposed is formed.

Next, this silicon substrate 10 is heated in a fluorine atmosphere, whereby the left side portion of the H-terminated GNR 31 exposed from the resist mask 30 is fluorinated. Consequently, in the left side portion of the H-terminated GNR 31, the F-terminated GNR 32 is formed. Consequently, a channel layer 34 in which the H-terminated GNR 31 and the F-terminated GNR 32 are bonded is formed.

The resist mask 30 is removed by ashing or wetting.

Figure 14D:
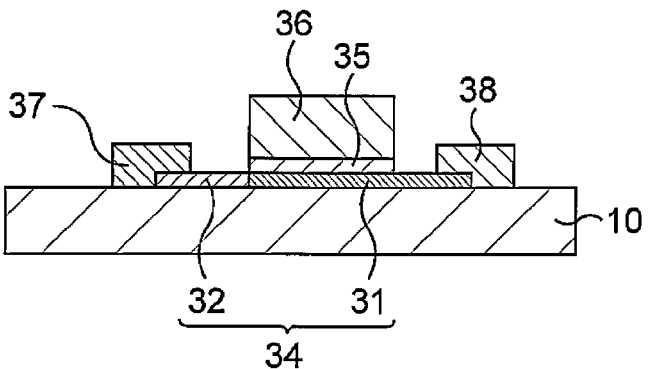

Subsequently, as illustrated in FIG. 14D, a source electrode 37 and a drain electrode 38 are formed.

In more detail, a resist is applied on the whole surface, and the resist is patterned by lithography. Consequently, a resist mask having openings from which the F-terminated GNR 32 and the H-terminated GNR 31 are exposed is formed.

Next, Ti whose work function is close to a Fermi level (about 4.3 eV) of the channel layer 34 which is a composite GNR is used here as an interface, and metals Ti (lower layer)/Au (upper layer) are deposited by a vapor deposition method or a sputtering method. Then, the resist mask and Ti/Au deposited thereon are removed by lift-off. Consequently, the source electrode 37 is formed on the F-terminated GNR 32, and the drain electrode 38 is formed on the H-terminated GNR 31.

Figure 14E:
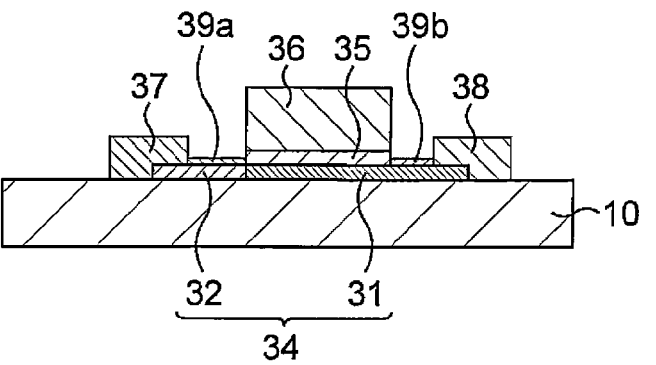

Subsequently, as illustrated in FIG. 14E, a PEI 39a is formed between the gate electrode 36 and the source electrode 37, and $F_4$-TCNQ 39b is formed between the gate electrode 36 and the drain electrode 38.

In more detail, by lithography, deposition of, for example, PEI being an n-type dopant molecule, and lift-off, the PEI 39a is formed on the F-terminated GNR 32 exposed between the gate electrode 36 and the source electrode 37. Further, by lithography, deposition of, for example, $F_4$-TCNQ being a p-type dopant molecule, and lift-off, the $F_4$-TCNQ 39b is formed on the H-terminated GNR 31 exposed between the gate electrode 36 and the drain electrode 38.

Thereafter, on exposed portions of the channel layer 34, a protective layer of PTCDA or the like is deposited, $HfO_2$ or the like is deposited by an ALD method, and the insulating material on the gate electrode 36, the source electrode 37, and the drain electrode 38 is removed. Then, through various post-processes, the transistor is formed.

The transistor according to this embodiment functions as the tunnel transistor having the $n^+p^-p^+$ structure.

According to this embodiment, by using the channel layer 34 of the graphene whose polarity control is possible, the tunnel transistor with the $n^+p^-p^+$ structure having high reliability and high performance is realized.

(Fourth Embodiment)

Next, a fourth embodiment will be described. In this embodiment, a tunnel transistor with a $p^+n^-n^+$ structure using GNRs will be described together with its manufacturing method.

FIG. 15A to FIG. 15E are schematic cross-sectional views illustrating the manufacturing method of the tunnel transistor having the $p^+n^-n^+$ structure according to the fourth embodiment in order of processes.

Figure 15A:
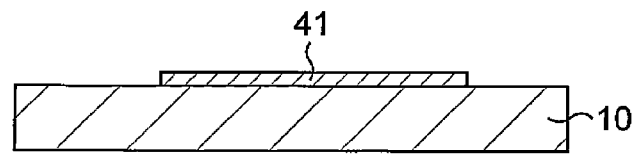
FIG. 15A to FIG. 15E are schematic cross-sectional views illustrating a method of manufacturing a tunnel transistor having a $p^+n^-n^+$ structure according to a fourth embodiment in order of processes.

First, as illustrated in FIG. 15A, a $NH_2$-terminated GNR 41 is formed.

In more detail, by using an anthracene dimer being a precursor of the GNR, whose edge portions are terminated with $NH_2$, it is polymerized on a Au(111) substrate or a Ag(111) substrate by heat energy by the same method as that of the first to third embodiments. Instead of the anthracene dimer, a pentacene dimer, a nonacene dimer, or like can be used. Consequently, the $NH_2$-terminated GNR 41 whose edge portions are $NH_2$-terminated is formed.

Next, the $NH_2$-terminated GNR 41 is transferred onto a silicon substrate 10 having an insulating film such as a silicon oxide film on a surface.

Figure 15B:
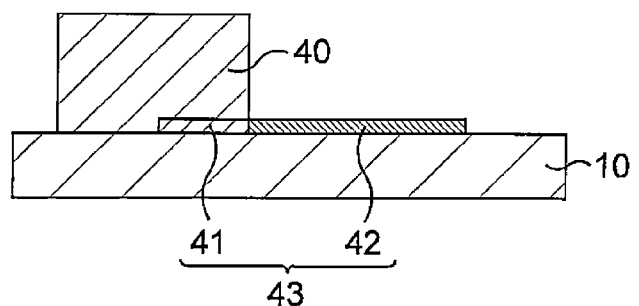

Subsequently, as illustrated in FIG. 15B, the $NH_2$-terminated GNR 41 except its one-side portion is formed into a H-terminated GNR 42.

In more detail, first, a resist is applied on the silicon substrate 10 so as to cover the $NH_2$-terminated GNR 41, and the resist is patterned by lithography. Consequently, a resist mask 40 covering only the one side (in the illustrated example, a left side) portion of the $NH_2$-terminated GNR 41 is formed.

Next, this silicon substrate 10 is heated in a hydrogen atmosphere. Consequently, the H-terminated GNR 42 is formed in the $NH_2$-terminated GNR 41 except its left end portion covered by the resist mask 40. Consequently, a channel layer 43 in which the $NH_2$-terminated GNR 41 and the H-terminated GNR 42 are bonded is formed.

The resist mask 40 is removed by ashing or wetting.

Figure 15C:
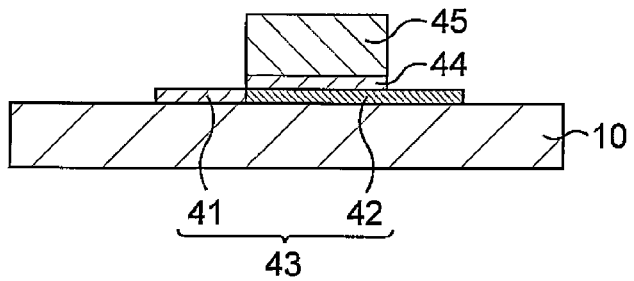

Subsequently, as illustrated in FIG. 15C, a gate insulating film 44 and a gate electrode 45 are formed.

In more detail, first, a resist is applied on the whole surface, and the resist is patterned by lithography. Consequently, a resist mask having an opening from which a portion, of a surface of the H-terminated GNR 42, corresponding to a center portion of the channel layer 43 is exposed is formed.

Next, Al is thinly deposited to about 1 nm on the whole surface by a sputtering method or the like, and by using this Al as a seed layer, an insulating material, for example, $HfO_2$ is deposited by an atomic layer deposition (ALD) method. Further, on $HfO_2$, metals (for example, Ti/Au) are deposited by a vapor deposition method or a sputtering method. The resist mask, and $HfO_2$ and Ti/Au deposited on the resist mask are removed by lift-off. Consequently, the gate electrode 45 formed of Ti/Au is formed on the portion, of the surface of the H-terminated GNR 41, corresponding to the center portion of the channel layer 43, via the gate insulating film 44 formed of $HfO_2$.

Figure 15D:
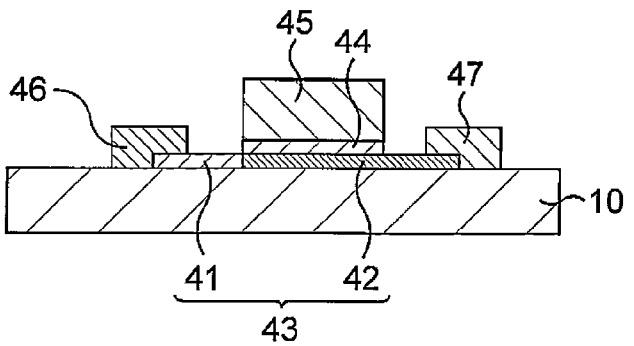

Subsequently, as illustrated in FIG. 15D, a source electrode 46 and a drain electrode 47 are formed.

In more detail, a resist is applied on the whole surface, and the resist is patterned by lithography. Consequently, a resist mask having openings from which the $NH_2$-terminated GNR 41 and the H-terminated GNR 42 are exposed is formed.

Next, Sc whose work function is close to a Fermi level (about 3.3 eV) of the channel layer 43 which is a composite GNR is used here as an interface, metals Sc (lower layer)/Au (upper layer) are deposited by a vapor deposition method or a sputtering method. Then, the resist mask and Sc/Au deposited thereon are removed by lift-off. Consequently, the source electrode 46 is formed on the $NH_2$-terminated GNR 41, and the drain electrode 47 is formed on the H-terminated GNR 42. At this time, a conductivity type of the $NH_2$-terminated GNR 41 is $p^+$ and a conductivity type of the H-terminated GNR 42 is $n^-$.

Figure 15E:
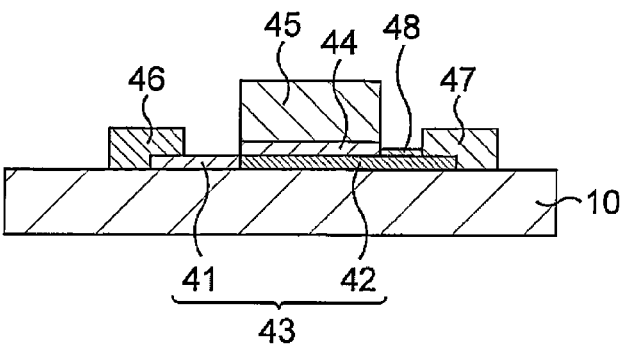

Subsequently, as illustrated in FIG. 15E, a PEI 48 is formed between the gate electrode 45 and the drain electrode 47.

In more detail, by lithography, deposition of, for example, PEI being an n-type dopant molecule, and lift-off, the PEI 48 is formed on the H-terminated GNR 42 exposed between the gate electrode 45 and the drain electrode 47. As a result of forming the PIE 48, the conductivity type of the H-terminated GNR 42 becomes $n^+$.

Thereafter, on exposed portions of the channel layer 43, a protective layer of PTCDA or the like is deposited, $HfO_2$ or the like is deposited by an ALD method, and the insulating material on the gate electrode 45, the source electrode 46, and the drain electrode 47 is removed. Then, through various post-processes, the transistor is formed.

The transistor according to this embodiment functions as the tunnel transistor having the $p^+n^-n^+$ structure.

According to this embodiment, by using the channel layer 43 of the graphene whose polarity control is possible, the tunnel transistor with the $p^+n^-n^+$ structure having high reliability and high performance is realized.

According to the present invention, by using a channel layer of graphene whose polarity control is possible, an electronic device having high reliability and high performance is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device comprising;
    a channel layer in which a plurality of graphene nanoribbons are bonded to each other in a longitudinal direction; and
    electrodes formed above the channel layer,
    wherein
    each of the plurality of graphene nanoribbons has a first edge portion and a second edge portion along the longitudinal direction which are terminated with modifying groups,
    the modifying groups of two kinds of the graphene nanoribbons directly bonded to each other are different from each other, and
    the modifying groups of the first edge portion and the modifying groups of the second edge portion are arranged in parallel along the longitudinal direction.

2. The electronic device according to claim 1, wherein the graphene nanoribbons have conduction bands and valence bands whose positions are different from each other.

3. The electronic device according to claim 1, wherein the modifying groups are two kinds or three kinds or more selected from H, F, Cl, OH, $NH_2$, and $CH_3$.

4. The electronic device according to claim 1, wherein, out of the two kinds of the graphene nanoribbons bonded to each other, one is n-doped and the other is p-doped.

5. The electronic device according to claim 1, wherein the channel layer constitutes a pnp structure or an npn structure by the graphene nanoribbons being bonded to each other.

6. The electronic device according to claim 1, wherein the channel layer constitutes a $p^+n^-$(or i)$n^+$ structure or an $n^+p^-$(or i)$p^+$ structure by the graphene nanoribbons being bonded to each other.

7. The electronic device according to claim 1, wherein the channel layer has a 10 nm width or less in a short-side direction thereof.

* * * * *